United States Patent
Wu

(10) Patent No.: US 9,144,150 B2
(45) Date of Patent: Sep. 22, 2015

(54) CONDUCTOR STRUCTURE WITH INTEGRATED VIA ELEMENT

(75) Inventor: Paul Y. Wu, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 144 days.

(21) Appl. No.: 13/452,600

(22) Filed: Apr. 20, 2012

(65) Prior Publication Data

US 2013/0277099 A1 Oct. 24, 2013

(51) Int. Cl.
*H05K 1/11* (2006.01)
*H05K 1/02* (2006.01)

(52) U.S. Cl.
CPC ............ *H05K 1/0221* (2013.01); *H05K 1/0242* (2013.01); *H05K 1/0251* (2013.01); *H05K 2201/098* (2013.01); *H05K 2201/09672* (2013.01); *H05K 2201/09854* (2013.01)

(58) Field of Classification Search
USPC .......... 174/266, 250, 255–257, 261, 262, 265
See application file for complete search history.

(56) References Cited

U.S. PATENT DOCUMENTS

| | | | |
|---|---|---|---|
| 5,946,600 A | 8/1999 | Hurwitz et al. | |
| 6,262,376 B1 | 7/2001 | Hurwitz et al. | |
| 6,262,478 B1 | 7/2001 | Hurwitz et al. | |
| 6,280,640 B1 | 8/2001 | Hurwitz et al. | |
| 6,535,088 B1 | 3/2003 | Sherman et al. | |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 8,169,792 B2 * | 5/2012 | Kariya et al. | 361/795 |
| 2003/0059151 A1 | 3/2003 | Brist et al. | |
| 2003/0230807 A1 | 12/2003 | Li et al. | |
| 2007/0178774 A1 * | 8/2007 | Yasumura et al. | 439/862 |
| 2009/0126983 A1 * | 5/2009 | Harvey et al. | 174/266 |
| 2010/0307798 A1 | 12/2010 | Izadian | |
| 2011/0141665 A1 * | 6/2011 | Fontana et al. | 361/601 |

* cited by examiner

*Primary Examiner* — Tremesha S Willis

(74) *Attorney, Agent, or Firm* — Kevin T. Cuenot; John J. King

(57) ABSTRACT

An electrical circuit structure can include a first trace formed using a first conductive layer and a second trace formed using a second conductive layer. The first trace can be vertically aligned with the second trace. The electrical circuit structure can include a via segment formed of conductive material in a third conductive layer between the first conductive layer and the second conductive layer. The via segment can contact the first trace and the second trace forming a first conductor structure configured to convey an electrical signal in a direction parallel to the first conductive layer.

20 Claims, 4 Drawing Sheets

CONDUCTOR STRUCTURE WITH INTEGRATED VIA ELEMENT

FIELD OF THE INVENTION

One or more embodiments disclosed within this specification relate to a conductor structure for use within electrical circuits. More particularly, one or more embodiments relate to the formation of a conductor structure using via technology.

BACKGROUND

Electrical circuit manufacturing processes continue to advance facilitating the creation of ever smaller devices using ever smaller (finer) design rules. Referring to integrated circuit (IC) technology using an organic substrate, for example, fine line traces can be formed on the order of approximately 20 μm. Similarly, design rules specifying spacing can be on the order of approximately 20 μm. Correspondingly, the thickness of dielectric layers of an electrical circuit, whether implemented using printed circuit board (PCB) technology or IC technology, tends to be shallow. Again referring to IC technology, the thickness of a dielectric layer can be on the order of approximately 30 μm.

Given the feature sizes and fine design rules noted, implementation of a differential channel that meets a target of 100 Ohm differential impedance typically has a narrow trace width on the order of approximately 25 μm and a trace height of approximately 15-20 μm. A channel formed using one or more traces with dimensions as described can suffer from a variety of different types of loss that affect the ability of the channel to propagate a signal, particularly at high frequencies.

Channels as described can suffer from a variety of different types of loss including, but not limited to, dielectric loss incurred as a result of the dielectric material, loss incurred as a result of any roughness on the surface of the trace(s), and loss due to the skin effect. In general, the "skin effect" refers to the tendency of an alternating electric current, e.g., a high frequency signal, to distribute itself within a conductor so that the current density is largest at or near the surface of the conductor and decreases at greater depths from the surface of the conductor toward the center. The electric current flows mainly at or in the "skin" of the conductor (e.g., the trace). The "skin" can be defined as the portion of the conductor between the outer surface and a level within the conductor called the skin depth. The skin effect causes the effective resistance of a conductor to increase at higher frequencies where the skin depth is smaller, thus reducing the effective cross-section of the conductor.

SUMMARY

One or more embodiments disclosed within this specification relate to a conductor structure for use within electrical circuits and, more particularly, to the formation of a conductor structure using via technology.

An embodiment can include an electrical circuit structure. The electrical circuit structure can include a first trace formed using a first conductive layer and a second trace formed using a second conductive layer. The first trace can be vertically aligned with the second trace. The electrical circuit structure can include a via segment formed of conductive material in a third conductive layer between the first conductive layer and the second conductive layer. The via segment can contact the first trace and the second trace forming a first conductor structure configured to convey an electrical signal in a direction parallel to the first conductive layer.

In one aspect, the via segment can be vertically aligned with the first trace and the second trace. In another aspect, the via segment can be longer in a direction that is parallel to the first trace and the second trace than in a direction perpendicular to the first trace and the second trace.

The electrical circuit structure can include a via element formed of conductive material in the third conductive layer between the first conductive layer and the second conductive layer. The via element can contact the first trace and the second trace as part of the first conductor structure. The via element can be separated from the via segment by a minimum distance. The via element also can be vertically aligned with the first trace and the second trace.

In another aspect, the electrical circuit structure can include a first reference plane located beneath the second trace forming a microstrip circuit. In yet another aspect, the electrical circuit structure can include a first reference plane located above the first trace and a second reference plane located below the second trace forming a stripline circuit.

The electrical circuit structure also can include a Faraday cage at least partially encompassing the first conductor structure.

The electrical circuit structure further can include a third trace formed using the first conductive layer and a fourth trace formed using the second conductive layer. The third trace can be vertically aligned with the fourth trace. The electrical circuit structure can include a via element formed of conductive material in the third conductive layer between the first conductive layer and the second conductive layer. The via element can contact the third trace and the fourth trace forming a second conductor structure.

In another aspect, the first conductor structure and the second conductor structure can form a differential pair.

Another embodiment can include an electrical circuit structure. The electrical circuit structure can include a first trace formed using a first conductive layer and a second trace formed using a second conductive layer. The first trace can be vertically aligned with the second trace. The electrical circuit structure can include a plurality of via elements formed of conductive material in a third conductive layer between the first conductive layer and the second conductive layer. Each via element of the plurality of via elements can contact the first trace and the second trace forming an integrated conductor structure configured to convey an electrical signal in a direction parallel to the first conductive layer.

In one aspect, each via element of the plurality of via elements can be vertically aligned with the first trace and the second trace.

In another aspect, the electrical circuit structure can include a first reference plane located beneath the second trace forming a microstrip circuit.

In still another aspect, the electrical circuit structure can include a first reference plane located above the first trace and a second reference plane located below the second trace forming a stripline circuit.

The electrical circuit structure also can include a Faraday cage at least partially encompassing the integrated conductor structure.

Another embodiment can include an electrical circuit. The electrical circuit can include a conductor structure. The conductor structure can include a first trace formed using a first conductive layer and a second trace formed using a second conductive layer. The first trace can be vertically aligned with the second trace. The electrical circuit can include a first via element formed of conductive material in a third conductive layer between the first conductive layer and the second conductive layer. The first via element can contact the first trace and the second trace forming an integrated conductor structure as part of a transmission channel configured to convey an electrical signal in a direction parallel to the first conductive layer.

The electrical circuit can include a second via element formed of conductive material in the third conductive layer between the first conductive layer and the second conductive layer. The second via element can contact the first trace and the second trace as part of the integrated conductor structure.

In one aspect, the electrical circuit can include a first reference plane located beneath the second trace forming a microstrip circuit.

In another aspect, the electrical circuit can include a first reference plane located above the first trace and a second reference plane located below the second trace forming a stripline circuit.

BRIEF DESCRIPTION OF THE DRAWINGS

FIG. 1-2 is a second perspective view of a conductor structure in accordance with another embodiment disclosed within this specification.

FIG. 1-3 is a third perspective view of a conductor structure in accordance with another embodiment disclosed within this specification.

FIG. 2 is a fourth perspective view of a conductor structure in accordance with another embodiment disclosed within this specification.

FIG. 3 is a fifth perspective view of a conductor structure in accordance with another embodiment disclosed within this specification.

DETAILED DESCRIPTION

Figure 1:
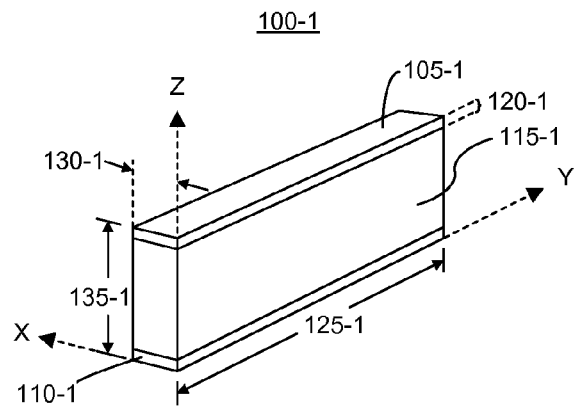
FIG. 1-1 is a first perspective view of a conductor structure in accordance with an embodiment disclosed within this specification.

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to a conductor structure for use within electrical circuits and, more particularly, to the formation of a conductor structure using via technology. In accordance with one or more embodiments disclosed within this specification, a conductor structure can be formed using a plurality of traces. Two traces, for example, each located in a different conductive layer of an electrical circuit, can be vertically aligned. A via segment can be formed between the two traces that contacts each respective trace to form a conductor structure that is an integrated and single unified conductor structure. The conductor structure has a larger cross-sectional area than that of a conventional trace. The resulting conductor structure can provide improved performance, e.g., low loss, particularly for high frequency applications.

The one or more embodiments disclosed within this specification can be implemented using manufacturing technologies in which a via (or vias) between conductor layers can be shaped in a conventional manner, e.g., as isolated dots, columns, or cylinders, and also using manufacturing technologies in which via shapes are not so limited. For instance, one or more manufacturing technologies allow the formation of a via (or vias) in any free form shape such as a trace, a cube, a cuboid, a rectangular cuboid, or a slight variation thereof (e.g., where each corner is need not be exactly 90 degrees), a plane, or the like. Accordingly, a transmission channel, as described within this specification, can be implemented as a differential or a single ended conductor structure using a via, or vias, as described herein.

The conductor structures disclosed within this specification can be used to form high frequency transmission channels whether implemented in a package substrate in the case of an IC or in a printed circuit board (PCB). Examples of high frequency transmission channels can include, for example, striplines and microstrip traces that can be created or formed using a "via layer." In addition to providing increased cross-sectional area, the conductor structures can be configured to provide a standard impedance. For example, the conductor structures can be configured to provide a 100 Ohm differential impedance. Other features, such as use of low loss dielectrics and smoothened surface profiles, can result in a very low loss transmission channel that is suitable for operating at high frequencies. For example, the transmission channels described within this specification can be used to transmit signals at rates of approximately 19 Gigabits per second (Gbps) up to approximately 56 Gbps. Appreciably, the structures can convey signals of lesser rates or frequencies.

In addition, the direct current (DC) resistance of the conductor structures disclosed within this specification is reduced due to the larger cross-sectional area that is attained. The one or more embodiments disclosed within this specification, for example, can obtain 1.5 db of insertion loss for signals of approximately 10 GHz-25 GHz when a transmission channel length of approximately 15 mm to approximately 25 mm is used. This level of insertion loss is achievable particularly when a low loss dielectric with a dissipation factor (DF) of approximately 0.008 (or within a range of approximately 0.01 to 0.003), and a surface process that can achieve near 2000 A smoothness (e.g., within range of approximately 500 A to 2000 A).

FIG. 1-1 is a first perspective view of a conductor structure 100-1 in accordance with an embodiment disclosed within this specification. Conductor structure 100-1 is an example of a conductor that can be implemented within an IC, e.g., in package substrate, or within a PCB. As pictured, conductor structure 100-1 is an integrated conductor structure that can include, or be formed of, a trace (e.g., a first trace) 105-1, a trace (e.g., a second trace) 110-1, and a via segment 115-1.

Trace 105-1 can be implemented using a first conductive layer of the electrical circuit. Trace 110-1 can be implemented using a second and different conductive layer of the electrical circuit. Each conductive layer can be implemented parallel to the plane defined by the x-axis and the y-axis. One example of a conductive material that can be used to form a conductive layer can be metal such as copper. The first conductive layer and the second conductive layer, for example, can be implemented within an IC or a PCB where the two conductive layers are separated by an insulating (e.g., a dielectric) layer. In general, trace 105-1 and trace 110-1 can be formed by removing portions of each respective conductive layer through an electrical circuit manufacturing process leaving behind a "patterned layer" that can include trace 105-1 and trace 110-1 in the first and second conductive layers, respectively.

As noted, the first conductive layer and the second conductive layer can be separated by an insulating layer. In some cases, the insulating layer separating two consecutive conductive layers is referred to as a via layer. Examples of dielectric materials that can be used can include, but are not limited to, the prepreg type including those with supporting glass fiber, film types including ABF film, or ceramic types.

The via layer can be used to form one or more via elements that can be configured to electrically couple trace 105-1 to trace 110-1. In general, a "via element" refers to a vertical electrical connection between different layers of conductors, or conductive layers, in an electrical circuit. In some cases, e.g., within ICs, the term "via" can refer to an opening formed within the insulating layer within which conductive material can be formed to implement the vertical electrical connection. As used within this specification, the terms "via," "via element," and "via segment" refer to the vertical, physical and electrical connection as opposed to simply the opening in which the connection is formed.

For purposes of illustration and ease of description, the phrase "via element" is used to refer to both a conventional via and a via segment. The phrase "via segment" is used to refer to a via that is shaped in a free form manner that is not restricted to a column, cylinder, plug, or dot (substantially spherical) shape that is characteristic of a conventional via. A via segment, for example, can be formed as a trace, a cube, a cuboid, a rectangular cuboid, a plane, or the like that is formed in an insulating layer. The term "via" is used to refer to a conventional via.

In one aspect, via segments can be formed using a process in which the various metal layers used to form trace 110-1, via segment 115-1, and trace 105-1 are formed using a series of patterned metal layers. Each layer can be formed as a patterned metal layer including, for example, the layer in which via segment 115-1 is formed. Layers can be formed using photoresist technology, for example, thereby allowing free-form shapes of via segment 115-1 to be formed, as is the case for each of traces 105-1 and 110-1. In this regard, the layer in which via segment 115-1 is formed is created from a metal layer that is separate from and different from the metal layers used to form traces 105-1 and 110-1. Subsequent to formation of the stacked structure of the metal layers in which trace 105-1, via segment 115-1, and trace 110-1 are formed, excess material (e.g., metal) can be removed to form conductor structure 100-1, which can be constructed on a surface of a base material or substrate, for example. Subsequently, insulating material as described, e.g., an oxide dielectric material, can be filled in surrounding conductor structure 100-1.

For purposes of illustration, various types of metal layers are not illustrated in FIG. 1. For example, metal adhesion layers that may be included to facilitate improved adhesion between metal layers and dielectric material are not shown. Further, barrier metal layers that may be included are not shown. In illustration, a first metal adhesion layer can be formed below trace 110-1 and a second metal adhesion layer can be formed between trace 105-1 and via segment 115-1. A barrier metal layer can be formed between trace 110-1 and via segment 115-1, or the like. It should be appreciated that the examples provided for constructing conductor structure 100-1 are provided for purposes of illustration and, as such, are not intended as limitations. Other techniques can be used to form conductor structure 100-1.

As pictured in FIG. 1-1, via segment 115-1 can be a rectangular cuboid in shape and have a length 125-1 that exceeds a width 130-1. In general, trace 105-1 is vertically aligned with trace 110-1. Trace 105-1 further can be shaped substantially similar to, if not the same as, trace 110-1, e.g., have a same width and height. Via segment 115-1 can have a same width as traces 105-1 and 110-1. Via segment 115-1 can be vertically aligned with both trace 105-1 and trace 110-1. Further, via segment 115-1 is in contact with an under surface of trace 105-1 and is in contact with a top surface of trace 110-1. In the example pictured, via segment 115-1 is formed in a rectangular shape that coincides with the length-wise shape and direction of trace 105-1 and trace 110-1. With via segment 115-1 formed in this manner, e.g., shaped as a trace, conductor structure 100-1 forms an integrated conductor structure that includes trace 105-1, trace 110-1, and via segment 115-1. It should be appreciated that trace 105-1, trace 110-1, and via segment 115-1 can be vertically aligned so that when viewed from overhead, a single conductor appears (e.g., only trace 105-1 is viewable) as each follows a same signal path or template that can travel any of a variety of directions in the x-y plane as part of the integrated conductor structure 100-1.

In general, a via segment such as via segment 115-1 is characterized in that the shape of the via segment can correspond to the shape or path taken by a trace in any of a variety of directions in the x-y plane. For example, traces 105-1 and 110-1 can extend and bend in any of a variety of angles, e.g., 45 and/or 90 degrees, within the x-y plane with via segment 115-1 implemented to follow that same path. Thus, conductor structure 100-1 can be used to connect a signal, or signals, from a die bump location to a destination package pin location, for example.

The length of the via segment generally will exceed the width and can exceed the width by a substantial amount. A via segment, for instance, can have a rectangular or square cross-section taken in the x-z plane. A via segment can have a rectangular (and in some instances square) cross-section taken in the x-y plane. For example, the length of a via segment can be twice, three times, or more, the width of the via segment. Thus, referring to the coordinate system of FIG. 1-1, a via segment can be longer in a direction (y-direction) that is parallel to the traces above and below forming the conductor structure than in a direction perpendicular thereto (e.g., either one or both of the x and z-directions). It further should be appreciated that while the via elements are generally illustrated with sharp, e.g., 90 degree, corners, the edges of via elements can be smoothed or rounded.

By comparison, a via will have a cross-section in the x-y plane that is circular or round in shape. Further, a via typically has a different diameter at the top of the via than at the bottom of the via. Thus, the cross section of a via in the x-z plane is not square or rectangular.

The overall height 135-1 of conductor structure 100-1, as shown, exceeds the height 120-1 of a single trace (e.g., trace 105-1) alone as is typically used to form a conductor. The resulting height 135-1 of conductor structure 100-1 includes twice the height 120-1 of a single trace plus the height of via segment 115-1. The resulting cross-sectional area of conductor structure 100 provides increased surface area over that of a single trace. This increased surface area means that conductor structure 100-1 is less susceptible to the skin effect and provides improved performance as a high frequency conductor.

In general, conductor structure 100-1 can be characterized by the direction in which electrical signals are propagated therein. Conductor structure 100-1 can carry signals in any direction parallel to the x-y plane as opposed to a direction parallel to the z-axis (and perpendicular to the x-y plane). Thus, conductor structure 100-1 can be used to propagate signals in the plane parallel to the layers used to create the integrated circuit in which conductor structure 100-1 is included as opposed to conveying signals in the vertical direction as is the case with conventional via technology.

Figures 1, 2:
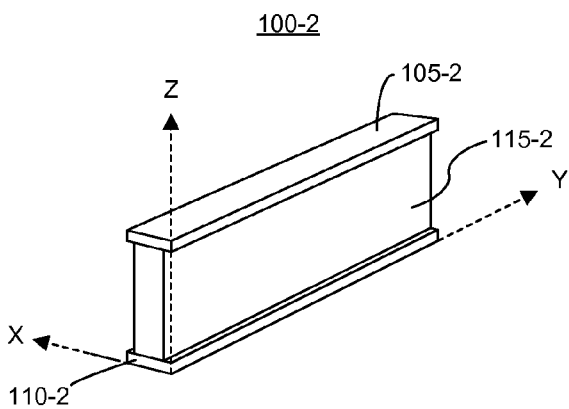

FIG. 1-2 is a second perspective view of a conductor structure 100-2 in accordance with another embodiment disclosed within this specification. Conductor structure 100-2 can be implemented substantially as described with reference to FIG. 1-1 and conductor structure 100-1, with the exception that via segment 115-2 has a width (or diameter) that is narrower than the width of trace 105-2 and trace 110-2. Thus, each of traces 105-2 and 110-2 can be said to "overhang" via segment 115-2. Via segment 115-2 still can be vertically aligned with both trace 105-2 and trace 110-2, creating an I-beam type of architecture.

In one aspect, the lesser width of via segment 115-2 compared to traces 105-2 and 110-2 can be a result of a particular process technology. Further, the lesser width of via segment 115-2 can be maintained within a particular range, e.g., percentage of the width of traces 105-2 and/or 110-2. For example, traces 105-2 and 110-2 can be approximately 60 μm in width while via segment 115-2 is approximately 40 μm in width. It should be appreciated that the particular widths disclosed herein are provided for purposes of illustration only and, as such, are not intended as limitations of the one or more embodiments disclosed herein.

Figures 1, 2, 3:
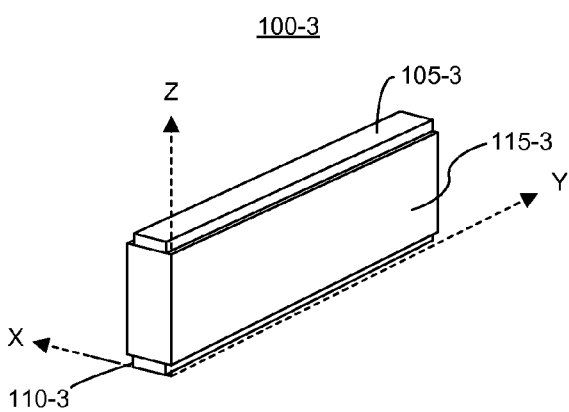
Figure 2:
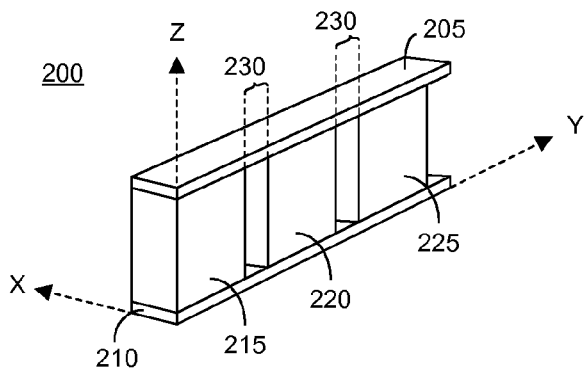
Figure 3:
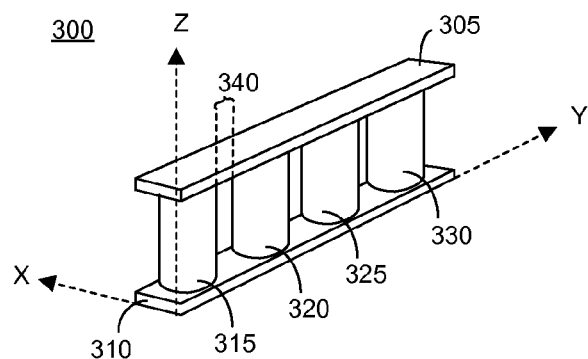

FIG. 1-3 is a second perspective view of a conductor structure 100-3 in accordance with another embodiment disclosed within this specification. Conductor structure 100-3 can be implemented substantially as described with reference to FIG. 1-1 and conductor structure 100-1, with the exception that via segment 115-3 has a width (or diameter) that is larger than the width of trace 105-3 and trace 110-3. Thus, via segment 115-3 can be said to "overhang" each of traces 105-3 and 110-3. Via segment 115-3 still can be vertically aligned with both trace 105-3 and trace 110-3.

In one aspect, the greater width of via segment 115-3 compared to traces 105-3 and 110-3 can be a result of a particular process technology. Further, the greater width of via segment 115-3 can be maintained within a particular range, e.g., percentage of the width of traces 105-3 and/or 110-3. For example, traces 105-3 and 110-3 can be approximately 40 μm in width while via segment 115-3 is approximately 60 μm in width. It should be appreciated that the particular widths disclosed herein are provided for purposes of illustration only and, as such, are not intended as limitations of the one or more embodiments disclosed herein.

FIG. 2 is a fourth perspective view of a conductor structure 200 in accordance with another embodiment disclosed within this specification. Conductor structure 200 is an example of a conductor that can be implemented within an IC or a PCB as part of an electrical circuit. As pictured, conductor structure 200 is an integrated conductor structure that can include a trace (e.g., a first trace) 205, a trace (e.g., a second trace) 210, and a plurality of via segments 215, 220, and 225.

Conductor structure 200 can be substantially similar to conductor structure 100 of FIG. 1 in terms of dimensions and structural aspects relating to the traces. Unlike conductor structure 100, however, a plurality of via segments are used as opposed to a single, continuous via segment. In one aspect, each of via segments 215-225 can be a same, or a substantially same, length. The length of each of via segments 215-225 in the y-direction still can exceed the width of each of via segments 215-225 in the x-direction. In one aspect, however, rather than via segments 215-225 being rectangular cuboid in shape, via segments 215-225 can be cubic. Via segment 215 can be separated from via segment 220 by a distance or spacing denoted as 230. Similarly, via segment 220 can be separated from via segment 225 by the distance or spacing 230. It should be appreciated that conductor structure 200 can be implemented to continue with further via segments and by extending traces 205 and 210 in the y-direction to achieve a desired length. As discussed, conductor structure 200 can continue in any direction within the x-y plane and the continuance in a particular direction, e.g., the y-direction, is for purposes of illustration only.

In one aspect, the length of each of via segments 215-225 can be limited to ensure that conductor structure 200 maintains physical integrity. For example, each of via segments 215-225 can be limited in length to approximately 2 millimeters. The distance or spacing 230, for example, can be approximately 100 μm. In another example, the spacing can be approximately 180 μm, 200 μm, or the like. Accordingly, conductor structure 200 illustrates an integrated conductor structure in which trace 205 and trace 210 are continuous, but in which the via segment is not.

It should be appreciated that the maximum length of a via segment is a function of the particular electrical circuit fabrication technology that is used and other structural considerations relating to stress effects and the like upon the electrical circuit. As such, the 2 millimeter restriction on length for a via segment and the 100 μm spacing between via segments are provided for purposes of illustration only and are not intended as limitations of the embodiments disclosed within this specification.

In another aspect, the spacing between consecutive pairs of via segments need not be the same. For example, in some cases, the spacing can be irregular in that the spacing between a first pair of consecutive via segments can be different from the spacing between a second (next) pair of consecutive via segments. In some cases, the spacing can be determined according to desired electrical properties, e.g., loss and/or impedance of conductor structure 200. Further, presuming that mechanical (e.g., physical) requirements of conductor structure 200 are met in terms of spacing to avoid fractures or other unintended mechanical discontinuities in the via segments, the spacing between via segments can be made greater or smaller to vary impedance of conductor structure 200. Similarly, via segments can be of varying length to achieve a desired impedance.

FIG. 3 is a fifth perspective view of a conductor structure 300 in accordance with another embodiment disclosed within this specification. Conductor structure 300 is an example of a conductor that can be implemented within an IC or a PCB. As pictured, conductor structure 300 is an integrated conductor structure that can include a trace (e.g., a first trace) 305, a trace (e.g., a second trace) 310, and a plurality of vias 315, 320, 325, and 330.

Conductor structure 300 can be substantially similar to conductor structure 100 and conductor structure 200 of FIGS. 1 and 2, respectively, in terms of dimensions and structural aspects relating to the traces. Unlike conductor structure 100, a plurality of vias are used. Unlike structure 200 where via segments are used, conductor structure 300 uses vias, e.g., conventional vias, to couple trace 305 with trace 310. Conductor structure 300 can be formed using an electrical circuit fabrication technology that supports creation of conventional vias as opposed to one having the ability to create via segments that effectively form an elongated channel or trace shape coupling two traces. Accordingly, each of vias 315-330 can be implemented as a conventional via. Thus, each of vias 315-330 can have rounded edges so as to be implemented as a cylinder or a column, including oval or elliptical columns (where the major axis is greater than the minor axis).

In one aspect, via 315 can be separated from via 320 by a distance or spacing denoted as 340. Via 320 can be separated from via 325 by the distance or spacing 340. Via 325 can be separated from via 330 by the distance or spacing 340. It should be appreciated, however, that as discussed with reference to FIG. 2, the spacing between consecutive pairs of vias need not be the same or constant.

In still another embodiment, a conductor structure can be implemented that uses a combination of vias and via segments. For example, traces such as trace 305 and trace 310 can be coupled using a pair of via elements (e.g., one via and one via segment). In this manner, via elements used in forming the conductor structure can alternate between via and via segment. Further, patterns of via/via segments can be used if so desired, for example, to control impedance within an electrical circuit.

Figure 4:
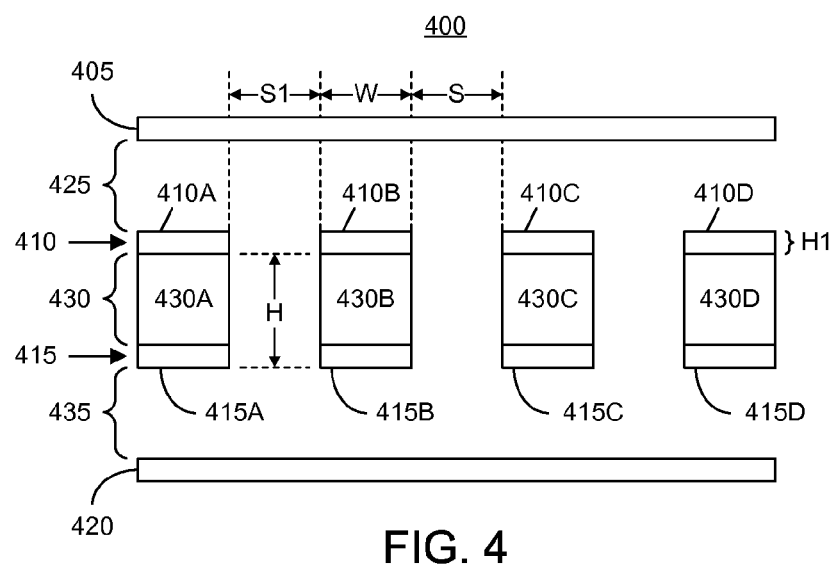
FIG. 4 is a first cross-sectional diagram illustrating a structure in accordance with another embodiment disclosed within this specification.

FIG. 4 is a first cross-sectional diagram illustrating a structure 400 in accordance with another embodiment disclosed within this specification. Structure 400 is an example of a high frequency transmission channel that is implemented using any of the conductor structures described with reference to FIGS. 1-3 of this specification. Structure 400 implements a stripline type of circuit in which one or more conductor structures are located between two parallel reference planes, e.g., two parallel conductive layers. As used within this specification, the phrase "reference plane" can refer to a ground plane or a power plane.

As shown, structure 400 includes a top reference plane 405, a conductive layer 410, a conductive layer 415, and a bottom reference plane 420. Each of reference planes 405 and 420 can be formed of, or implemented as, a conductive layer. Conductive layers 410 and 415 can be patterned layers in which one or more traces can be formed. Reference plane 405 can be separated from conductive layer 410 by an insulating layer 425. Conductive layer 410 can be separated from conductive layer 415 by an insulating layer 430. Finally, conductive layer 415 can be separated from reference plane 420 by an insulating layer 435. Via elements, e.g., vias and/or via segments, can be implemented in any one of insulating layers 425, 430, and/or 435.

Each trace formed using a particular conductive layer is represented by the reference number for that conductive layer in combination with a letter used to reference the particular structure of which the trace is a part. For example, traces formed of conductive layer 410 are labeled 410A, 410B, 410C, and 410D and traces formed of conductive layer 415 are labeled 415A, 415B, 415C, and 415D. Via elements are represented with a reference number corresponding to the particular layer in which the via elements are implemented, e.g., 430, in combination with the letter representing the particular structure of which the via element is a part. This standard for reference numbers is used throughout the remaining figures of this specification.

Structure 400 includes a conductor structure B and a conductor structure C. Conductor structure B can be formed of trace 410B, trace 415B, and via element 430B located between, and in contact with, traces 410B and 410C. Conductor structure C can be formed of trace 410C, trace 415C, and via element 430C located between, and in contact with, traces 410C and 415C. In one arrangement, conductor structures B and C can form a differential pair.

In another aspect, each of conductor structures B and C are included within a Faraday cage formed using conductor structures A and D. Conductor structures A and D, for example, can represent two sides of a continuous, conductor structure shown in cross-section that surrounds conductor structures B and C on all sides, with the exception of the top and bottom. Thus, conductor structures A and D represent conductive "walls" formed to encompass, or surround, at least partially, conductor structures B and C. In the example pictured in FIG. 4, the walls of the Faraday cage, e.g., conductor structures A and D having via elements 430A and 430D, are the same height as, and are horizontally aligned with, conductor structures B and C.

For purposes of illustration, a typical insulating (e.g., dielectric) layer thickness (H) can be approximately 50 μm. A typical conductor layer (and thus trace) thickness (H1) can be approximately 15 μm. Thus, conductor structure B, for example, has a height of approximately 15 μm+50 μm=65 μm. The width (W) of a trace can be approximately 40 μm. The spacing (S) between traces can be approximately 80 μm. The spacing (S1) from conductor B to a co-planar return plane (edge of the Faraday cage and conductor A) can be approximately 80 μm. Thus, the cross-sectional width (e.g., circumference) of conductor structure B is approximately 65 μm×2+40 μm×2=210 μm.

By comparison, the cross-sectional width (circumference) of a conventional trace (e.g., trace 410B alone) is approximately 40 μm×2+15 μm×2=110 μm. Other technologies such as skip-layer techniques in which wider traces are used increase the trace width from approximately 40 μm to 70 μm. Accordingly, using skip-layer techniques, the cross-sectional width of a trace is still approximately 70 μm×2+15 μm×2=170 μm. Accordingly, conductor structures B and C, for example, provide increased surface area (thereby reducing skin effect) and further provide improved trace density, e.g., improved channel pitch.

It should be appreciated that the width, height, and spacing dimensions are provided for purposes of illustration and are not intended as limitations of the one or more embodiments disclosed within this specification. The dimensions can be calibrated or otherwise adjusted through modeling and characterization to reach a desired impedance target for single ended conductors and/or for differential pairs such as, for example, 100 Ohms. Further, the dimensions can be varied through changes in the dielectric constant, which was assumed to be approximately 3.2 to 3.4 in the example above for the dielectric material used.

In another embodiment, structure 400 can be implemented as a single-ended transmission channel. For example, either conductor structure B or conductor structure C can be removed so that only a single conductor structure (i.e., B or C) is included between conductor structures A and D. In an single conductor structure, the conductor structure can be centered between the walls of the Faraday cage.

As discussed with reference to FIG. 1, conductor structures A, B, C, and D can be formed by building multiple patterned metal layers. Once conductor structures A, B, C, and D are formed, insulating layers 430 and 425 can be added or filled. Thus, whereas conventional techniques create openings in an insulating layer already located on a base and allow metal to flow into the openings to create vias when forming the metal layer in which traces are to be implemented, insulating layers 430 and 425 are built up after formation of conductor structures A, B, C, and D to surround conductor structures A, B, C, and D.

Figure 5:
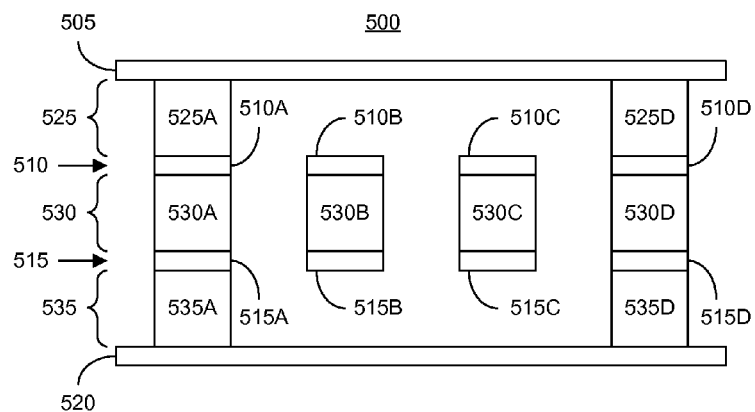
FIG. 5 is a second cross-sectional diagram illustrating a structure in accordance with another embodiment disclosed within this specification.

FIG. 5 is a second cross-sectional diagram illustrating a structure 500 in accordance with another embodiment disclosed within this specification. Structure 500 is an example of a high frequency transmission channel that is implemented using any of the conductor structures described with reference to FIGS. 1-3 of this specification. Structure 500 implements a stripline type circuit in which one or more conductor structures are located between two parallel reference planes.

As shown, structure 500 includes a top reference plane 505, a conductive layer 510, a conductive layer 515, and a bottom reference plane 520. Each of reference planes 505 and 520 can be formed of, or implemented as, a conductive layer. Conductive layers 510 and 515 can be patterned layers in which one or more traces can be formed. Reference plane 505 can be separated from conductive layer 510 by an insulating layer 525. Conductive layer 510 can be separated from conductive layer 515 by an insulating layer 530. Finally, conductive layer 515 can be separated from reference plane 520 by an insulating layer 535. Via elements, e.g., vias and/or via segments, can be implemented in any one of insulating layers 525, 530, and/or 535.

Structure 500 includes a conductor structure B and a conductor structure C. Conductor structure B can be formed of trace 510B, trace 515B, and via element 530B located between, and in contact with, traces 510B and 510C. Conductor structure C can be formed of trace 510C, trace 515C, and via element 530C located between, and in contact with, traces 510C and 515C. In one arrangement, conductor structures B and C can form a differential pair.

As shown, each of conductor structures B and C are included within a Faraday cage formed using conductor structures A and D. Conductor structure A can be formed of via elements 525A, 530A, and 535A, and traces 510A and 515A. Conductor structure D can be formed of via elements 525D, 530D, and 535D, and traces 510D and 515D. It should be appreciated that conductor structures A and D each can form a continuous structure, e.g., a wall, from reference plane 505 to reference plane 520 and that each of conductor structures A and D couples with both reference planes 505 and 520. Conductor structures A and D, for example, can represent two sides of a continuous, conductor structure, shown in cross-section, that surrounds conductor structures B and C on all sides, with the exception of the top and bottom. Thus, conductor structures A and D represent conductive "walls" formed to encompass, or surround, at least partially, conductor structures B and C. In the example pictured in FIG. 5, conductor structures A and D have heights exceeding the heights of conductor structures B and C. As shown, each of conductor structures A and D extends higher and lower than conductor structures B and C.

In another embodiment, structure 500 can be implemented as a single-ended transmission channel. For example, either conductor structure B or conductor structure C can be removed so that only a single conductor structure (i.e., B or C) is included within conductor structures A and D. In the case of a single conductor structure, the conductor structure can be centered between the walls of the Faraday cage.

Figure 6:
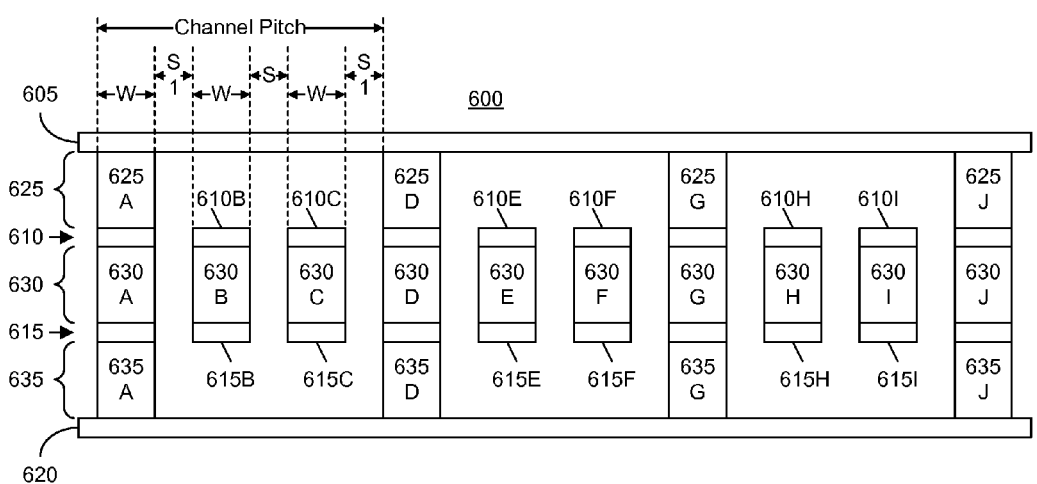
FIG. 6 is a third cross-sectional diagram illustrating a structure in accordance with another embodiment disclosed within this specification.

FIG. 6 is a third cross-sectional diagram illustrating a structure 600 in accordance with another embodiment disclosed within this specification. Structure 600 is an example of a high frequency transmission channel that is implemented using any of the conductor structures described with reference to FIGS. 1-3 of this specification. Structure 600 implements multiple stripline type circuits in which one or more conductor structures of each respective circuit are located between two parallel reference planes.

As shown, structure 600 includes a top reference plane 605, a conductive layer 610, a conductive layer 615, and a bottom reference plane 620. Each of reference planes 605 and 620 can be formed of a conductive layer. Conductive layers 610 and 615 can be patterned layers in which one or more traces can be formed. Reference plane 605 can be separated from conductive layer 610 by an insulating layer 625. Conductive layer 610 can be separated from conductive layer 615 by an insulating layer 630. Finally, conductive layer 615 can be separated from reference plane 620 by an insulating layer 635. Via elements, e.g., vias and/or via segments, can be implemented in any one of insulating layers 625, 630, and/or 635.

Structure 600 includes three conductor structure pairs, e.g., differential pairs. The first pair includes conductor structure B and conductor structure C. Conductor structure B can be formed of trace 610B, trace 615B, and via element 630B located between, and in contact with, traces 610B and 615B. Conductor structure C can be formed of trace 610C, trace 615C, and via element 630C located between, and in contact with, traces 610C and 615C.

The second pair includes conductor structure E and conductor structure F. Conductor structure E can be formed of trace 610E, trace 615E, and via element 630E located between, and in contact with, traces 610E and 615E. Conductor structure F can be formed of trace 610F, trace 615F, and via element 630F located between, and in contact with, traces 610F and 615F.

The third pair includes conductor structure H and conductor structure I. Conductor structure H can be formed of trace 610H, trace 615H, and via element 630H located between, and in contact with, traces 610H and 615H. Conductor structure I can be formed of trace 610I, trace 615I, and via element 630I located between, and in contact with, traces 610I and 615I.

Conductor structures B and C are included within a Faraday cage formed using conductor structures A and D. Conductor structure A can be formed of via elements 625A, 630A, and 635A, and traces 610A and 615A. Conductor structure D can be formed of via elements 625D, 630D, and 635D, and traces 610D and 615D. It should be appreciated that conductor structures A and D each can form a continuous structure, e.g., a wall, from reference plane 605 to reference plane 620 and that each of conductor structures A and D couples with both reference planes 605 and 620.

Conductor structures E and F are included within another Faraday cage formed using conductor structures D and G. Conductor structure G can be formed of via elements 625G, 630G, and 635G, and traces 610G and 615G. As illustrated, conductor structure D is incorporated into the Faraday cage encompassing conductor structures B and C and also into the Faraday cage encompassing conductor structures E and F. It should be appreciated that conductor structure G can form a continuous structure, e.g., a wall, from reference plane 605 to reference plane 620 and that conductor structure G couples with both reference planes 605 and 620.

Conductor structures H and I are included within another Faraday cage formed using conductor structures G and J. Conductor structure J can be formed of via elements 625J, 630J, and 635J, and traces 610J and 615J. It should be appreciated that conductor structure J can form a continuous structure, e.g., a wall, from reference plane 605 to reference plane 620 and that conductor structure J couples with both reference planes 605 and 620. As illustrated, conductor structure G is incorporated into the Faraday cage encompassing conductor structures E and F and also into the Faraday cage encompassing conductor structures H and I.

In another embodiment, structure 600 can be implemented as a series of single-ended transmission channels. For example, either conductor structure B or conductor structure C can be removed so that only a single conductor structure (i.e., B or C) is located between conductor structures A and D. Similarly, either conductor structure E or conductor structure F can be removed so that only a single conductor structure (i.e., E or F) is included between conductor structures D and G. Lastly, either conductor structure H or conductor structure I can be removed so that only a single conductor structure (i.e., H or I) is included between conductors structures G and J.

FIG. 6 illustrates an embodiment supporting high transmission channel packing density. In order to attain higher packing density of transmission channels while keeping good channel to channel isolation, FIG. 6 illustrates a configuration in which a transmission channel implementing a stripline configuration achieves a channel pitch of 3×W+2×S1+S. Using the exemplary dimensions previously noted with respect to FIG. 4, a channel pitch of approximately 360 µm (3×40 µm+2×80 µm+80 µm) can be achieved.

Figure 7:
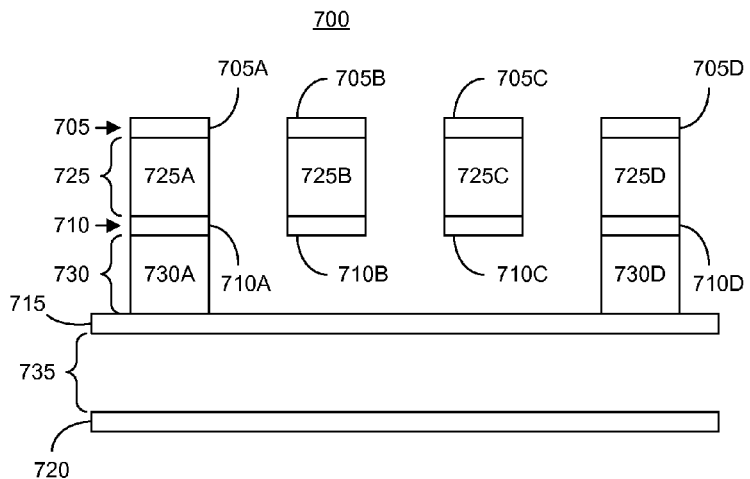
FIG. 7 is a fourth cross-sectional diagram illustrating a structure in accordance with another embodiment disclosed within this specification.

FIG. 7 is a fourth cross-sectional diagram illustrating a structure 700 in accordance with another embodiment disclosed within this specification. Structure 700 is an example of a high frequency transmission channel that is implemented using any of the conductor structures described with reference to FIGS. 1-3 of this specification. Structure 700 implements a microstrip type of circuit in which a reference plane is implemented below one or more conductor structures, but where a reference plane is not implemented above (e.g., not immediately above) the one or more conductor structures. Structure 700 is also referred to as a surface, coplanar waveguide.

As shown, structure 700 includes a conductive layer 705, a conductive layer 710, a reference plane 715, and a reference plane 720. Conductive layers 705 and 710 can be patterned layers in which one or more traces can be formed. Each of reference planes 715 and 720 can be formed of a conductive layer. Conductive layer 705 can be separated from conductive layer 710 by an insulating layer 725. Conductive layer 710 can be separated from reference plane 715 by an insulating layer 730. Finally, reference plane 715 can be separated from reference plane 720 by an insulating layer 735. Via elements, e.g., vias and/or via segments, can be implemented any one of insulating layers 725, 730, and/or 735.

Structure 700 includes a conductor structure B and a conductor structure C. Conductor structure B can be formed of trace 705B, trace 710B, and via element 725B located between, and in contact with, traces 705B and 710B. Conductor structure C can be formed of trace 705C, trace 710C, and via element 725C located between, and in contact with, traces 705C and 710C. In one arrangement, conductor structures B and C can form a differential pair.

As shown, each of conductor structures B and C are included within a Faraday cage formed using conductor structures A and D. Conductor structure A can be formed of via elements 725A and 730A, and traces 705A and 710A. Conductor structure D can be formed of via elements 725D and 730D, and traces 705D and 710D. It should be appreciated that conductor structures A and D each can form a continuous structure, e.g., a wall, from conductive layer 705 to reference plane 715 and that each of conductor structures A and D couples with both conductive layer 705 and reference plane 715. In the example pictured in FIG. 7, the walls of the Faraday cage, e.g., conductor structures A and D, have heights exceeding the heights of conductor structures B and C. As shown, the top of each of conductor structures A and D is aligned with the tops of conductor structures B and C. The bottom of each of conductor structures A and D extend lower than conductor structures B and C.

In another embodiment, structure 700 can be implemented as a single-ended transmission channel. For example, either conductor structure B or conductor structure C can be removed so that only a single conductor structure (i.e., B or C) is located between conductor structures A and D. In a single conductor architecture, the single conductor can be centered between the walls of the Faraday cage.

Figure 8:
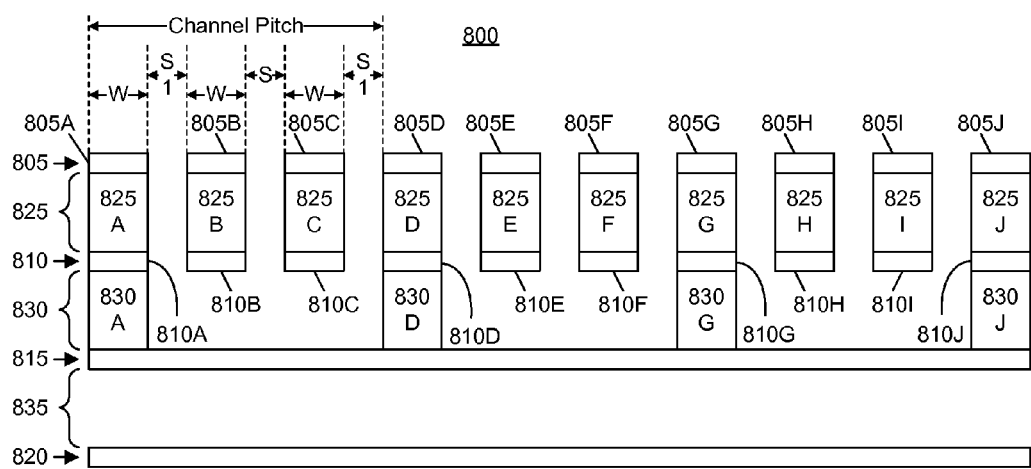
FIG. 8 is a fifth cross-sectional diagram illustrating a structure in accordance with another embodiment disclosed within this specification.

FIG. 8 is a fifth cross-sectional diagram illustrating a structure 800 in accordance with another embodiment disclosed within this specification. Structure 800 is an example of a high frequency transmission channel that is implemented using any of the conductor structures described with reference to FIGS. 1-3 of this specification. Structure 800 implements multiple microstrip type circuits in which a reference plane exists below one or more conductor structures of each respective circuit, but where a reference plane is not positioned above (e.g., not immediately above) the one or more conductors. Structure 800 represents a plurality of surface, coplanar waveguides.

As shown, structure 800 includes a conductive layer 805, a conductive layer 810, a reference plane 815, and a reference plane 820. Conductive layers 805 and 810 can be patterned layers in which one or more traces can be formed. Each of reference planes 815 and 820 can be formed of a conductive layer. Conductive layer 805 can be separated from conductive layer 810 by an insulating layer 825. Conductive layer 810 can be separated from reference plane 815 by an insulating layer 830. Finally, reference plane 815 can be separated from reference plane 820 by an insulating layer 835. Via elements, e.g., vias and/or via segments, can be implemented any one of insulating layers 825, 830, and/or 835.

Structure 800 includes three conductor structure pairs, e.g., differential pairs. The first pair includes conductor structure B and conductor structure C. Conductor structure B can be formed of trace 805B, trace 810B, and via element 825B located between, and in contact with, traces 805B and 810B. Conductor structure C can be formed of trace 805C, trace 810C, and via element 825C located between, and in contact with, traces 805C and 810C.

The second pair includes conductor structure E and conductor structure F. Conductor structure E can be formed of trace 805E, trace 810E, and via element 825E located between, and in contact with, traces 805E and 810E. Conductor structure F can be formed of trace 805F, trace 810F, and via element 825F located between, and in contact with, traces 805F and 810F.

The third pair includes conductor structure H and conductor structure I. Conductor structure H can be formed of trace 805H, trace 810H, and via element 825H located between, and in contact with, traces 805H and 810H. Conductor structure I can be formed of trace 805I, trace 810I, and via element 825I located between, and in contact with, traces 805I and 810I.

Conductor structures B and C are included within a Faraday cage formed using conductor structures A and D. Conductor structure A can be formed of via elements 825A and 830A and traces 805A and 810A. Conductor structure D can be formed of via elements 825D and 830D, and traces 805D and 810D. It should be appreciated that conductor structures A and D each can form a continuous structure, e.g., a wall, from conductive layer 805 to reference plane 815 and that each of conductor structures A and D couples with both conductive layer 805 and reference plane 815.

Conductor structures E and F are included within another Faraday cage formed using conductor structures D and G. Conductor structure G can be formed of via elements 825G and 830G, and traces 805G and 810G. It should be appreciated that conductor structure G can form a continuous structure, e.g., a wall, from conductive layer 805 to reference plane 815 and that conductor G couples with both conductive layer 805 and reference plane 815. As illustrated, conductor structure D is incorporated into the Faraday cage encompassing conductor structures B and C and also into the Faraday cage encompassing conductor structures E and F.

Conductor structures H and I are included within another Faraday cage formed using conductor structures G and J. Conductor structure J can be formed of via elements 825J and 830J, and traces 805J and 810J. It should be appreciated that conductor structure J can form a continuous structure, e.g., a wall, from conductive layer 805 to reference plane 815 and that conductor J couples with both conductive layer 805 and reference plane 815. As illustrated, conductor structure G is incorporated into the Faraday cage encompassing conductor structures E and F and also into the Faraday cage encompassing conductor structures H and I.

In another embodiment, structure 800 can be implemented as a series of single-ended transmission channels. For example, either conductor structure B or conductor structure C can be removed so that only a single conductor structure (i.e., B or C) is located between conductor structures A and D. Similarly, either conductor structure E or conductor structure F can be removed so that only a single conductor structure (i.e., E or F) is located between conductor structures D and G. Lastly, either conductor structure H or conductor structure I can be removed so that only a single conductor structure (i.e., H or I) is located between conductor structures G and J. It should be appreciated that in a single conductor structure architecture, the single conductor can be centered between the walls of the Faraday cage.

FIG. 8 illustrates an embodiment supporting high transmission channel packing density. In order to attain higher packing density of transmission channels while keeping good channel to channel isolation, FIG. 8 illustrates a configuration in which a transmission channel implementing a microstrip circuit configuration achieves a channel pitch of 3×W+2×S1+S. Using the exemplary dimensions previously noted with respect to FIG. 4, a channel pitch of approximately 360 μm (3×40 μm+2×80 μm+80 μm) can be achieved.

Though not illustrated with reference to FIGS. 2-8, it should be appreciated that a conductor structure can be implemented so that the traces overhang the via element or the via element overhangs the traces as illustrated with reference to FIGS. 1-2 and 1-3. Due to technology constraints, e.g., when overhang in either case is not preferable, the via element can be omitted from portions of the conductor structure, but retained for implementation of side walls forming the Faraday cage. Typically, however, the via element(s) are be retained in the beginning/launching points and the ending points of the transmission channel, e.g., at the origination and termination points of the transmission channel. Further, extra via elements that are used to connect from the upper layers to the transmission channel (or conductor structure) are typically needed at the origination points of the transmission channel to facilitate signals coupling onto the transmission channel from a location within an IC. Similarly extra via elements are needed that connect the transmission channel (or conductor structures) to the package pin layers at the ending points to allow signals to couple from the package of an IC to the package pins.

The one or more embodiments disclosed within this specification describe conductor structures that provide improved performance for high frequency applications in terms of reduced loss, whether from dielectric loss, insertion loss, skin effect, or the like. The conductor structures provide improved DC performance and can be used for high frequency transmission channels such as microstrip type circuits and/or stripline type circuits.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another, unless an ordering is stated explicitly or the context requires.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An electrical circuit structure of an integrated circuit, comprising:

a plurality of conductive layers on a substrate of the integrated circuit;
a first trace formed using a first conductive layer of the plurality of conductive layers;
a second trace formed using a second conductive layer of the plurality of conductive layers;
wherein the first trace is vertically aligned with the second trace; and
a plurality of via segments formed of conductive material between the first conductive layer and the second conductive layer, wherein each via segment fills an opening within an insulating layer between the first conductive layer and the second conductive layer;
wherein spacing between the plurality of via segments is determined to achieve a desired electrical property; and
wherein the plurality of via segments contact the first trace and the second trace to electrically connect the plurality of via segments and to form a first conductor structure configured to convey an electrical signal in a direction parallel to the first conductive layer.

2. The electrical circuit structure of claim 1, wherein the plurality of via segments is vertically aligned with the first trace and the second trace.

3. The electrical circuit structure of claim 1, wherein a via segment of the plurality of via segments is longer in a direction that is parallel to the first trace and the second trace than in a direction perpendicular to the first trace and the second trace.

4. The electrical circuit structure of claim 1, wherein each via segment of the plurality of via segments has rounded edges.

5. The electrical circuit structure of claim 4, wherein a via segment of the plurality of via segments is separated from another via segment by a minimum distance.

6. The electrical circuit structure of claim 1, further comprising:
a first reference plane located beneath the second trace forming a microstrip circuit.

7. The electrical circuit structure of claim 1, further comprising:
a first reference plane located above the first trace; and
a second reference plane located below the second trace forming a stripline circuit.

8. The electrical circuit structure of claim 1, further comprising:
a Faraday cage at least partially encompassing the first conductor structure.

9. The electrical circuit structure of claim 1, further comprising:
a third trace formed using the first conductive layer;
a fourth trace formed using the second conductive layer;
wherein the third trace is vertically aligned with the fourth trace; and
a via element formed of conductive material between the first conductive layer and the second conductive layer;
wherein the via element contacts the third trace and the fourth trace forming a second conductor structure.

10. The electrical circuit structure of claim 9, wherein the first conductor structure and the second conductor structure form a differential pair.

11. An electrical circuit structure of an integrated circuit, comprising:
a plurality of conductive layers on a substrate of the integrated circuit;
a first trace formed using a first conductive layer of the plurality of conductive layers;
a second trace formed using a second conductive layer of the plurality of conductive layers;
wherein the first trace is vertically aligned with the second trace; and
a plurality of via elements formed of conductive material between the first conductive layer and the second conductive layer, wherein each via element fills an opening within an insulating layer between the first conductive layer and the second conductive layer;
wherein each via element of the plurality of via elements contacts the first trace and the second trace to electrically connect the plurality of via elements and to form an integrated conductor structure configured to convey an electrical signal in a direction parallel to the first conductive layer.

12. The electrical circuit structure of claim 11, wherein each via element of the plurality of via elements is vertically aligned with the first trace and the second trace.

13. The electrical circuit structure of claim 11, further comprising:
a first reference plane located beneath the second trace forming a microstrip circuit.

14. The electrical circuit structure of claim 11, further comprising:
a first reference plane located above the first trace; and
a second reference plane located below the second trace forming a stripline circuit.

15. The electrical circuit conductor of claim 11, further comprising:
a Faraday cage at least partially encompassing the integrated conductor structure.

16. An electrical circuit in an integrated circuit, comprising:
a plurality of conductive layers on a substrate of the integrated circuit; and
a conductor structure comprising:
a first trace formed using a first conductive layer of the plurality of conductive layers;
a second trace formed using a second conductive layer of the plurality of conductive layers;
wherein the first trace is vertically aligned with the second trace; and
a plurality of via elements formed of conductive material between the first conductive layer and the second conductive layer, wherein each via element fills an opening within an insulating layer between the first conductive layer and the second conductive layer;
wherein the plurality of via elements contacts the first trace and the second trace to electrically connect the plurality of via elements and to form an integrated conductor structure as part of a transmission channel configured to convey an electrical signal in a direction parallel to the first conductive layer.

17. The electrical circuit of claim 16, further comprising:
a Faraday cage at least partially encompassing the conductor structure.

18. The electrical circuit of claim 16, further comprising:
a first reference plane located beneath the second trace forming a microstrip circuit.

19. The electrical circuit of claim 16, further comprising:
a first reference plane located above the first trace; and
a second reference plane located below the second trace forming a stripline circuit.

20. The electrical circuit of claim 18 wherein no reference plane is positioned immediately above the integrated conductor structure.

* * * * *